United States Patent
Perumal et al.

(10) Patent No.: US 12,493,094 B2
(45) Date of Patent: Dec. 9, 2025

(54) CIRCUIT CALIBRATION SYSTEMS

(71) Applicant: Hamilton Sundstrand Corporation, Charlotte, NC (US)

(72) Inventors: Rajkumar Perumal, Bangalore (IN); Nageswara Rao Kalluri, Bangalore (IN); Sridhar Katakam, Bangalore (IN); Pravinsharma Kaliyannan Eswaran, Bangalore (IN); Surendra Somasekhar Valleru, Bangalore (IN)

(73) Assignee: Hamilton Sundstrand Corporation, Charlotte, NC (US)

( * ) Notice: Subject to any disclaimer, the term of this patent is extended or adjusted under 35 U.S.C. 154(b) by 178 days.

(21) Appl. No.: 18/133,930

(22) Filed: Apr. 12, 2023

(65) Prior Publication Data

US 2023/0333192 A1 Oct. 19, 2023

(30) Foreign Application Priority Data

Apr. 16, 2022 (IN) .............................. 202241022531

(51) Int. Cl.
  *G01R 35/00* (2006.01)
  *G01R 31/28* (2006.01)

(52) U.S. Cl.
  CPC ....... *G01R 35/005* (2013.01); *G01R 31/2851* (2013.01)

(58) Field of Classification Search
  None
  See application file for complete search history.

(56) References Cited

U.S. PATENT DOCUMENTS

| | | | |
|---|---|---|---|
| 4,160,134 A | 7/1979 | Carroll | |
| 5,319,370 A | 6/1994 | Signore et al. | |
| 5,400,385 A | 3/1995 | Blake et al. | |
| 7,427,866 B2 | 9/2008 | Ellersick et al. | |
| 7,466,249 B2* | 12/2008 | Chen .................. | H03M 1/1019 341/118 |
| 9,612,294 B2* | 4/2017 | Putinier ................. | G01R 33/07 |
| 10,079,610 B2 | 9/2018 | Bogner et al. | |
| 10,502,807 B2* | 12/2019 | Steuer .................. | G01D 18/008 |
| 11,502,683 B2* | 11/2022 | Onódy .................... | G05F 1/575 |
| 2007/0132617 A1* | 6/2007 | Le ....................... | H03M 1/1014 341/120 |
| 2010/0283773 A1* | 11/2010 | Kim ........................ | G09G 3/20 324/691 |
| 2017/0115340 A1* | 4/2017 | Sung ......................... | G05F 3/02 |
| 2019/0072633 A1* | 3/2019 | Steuer .............. | G01R 19/16561 |

OTHER PUBLICATIONS

Extended European Search Report, of the European Patent Office, dated Sep. 6, 2023, in corresponding European Patent Application No. 23168203.0.

(Continued)

*Primary Examiner* — Jermele M Hollington

(57) ABSTRACT

A circuit calibration system can include a calibration voltage source, a calibration output line, and a variable voltage system connected between the calibration voltage source and the calibration output line. The variable voltage system can be configured to provide a variable calibration voltage to the calibration output line.

20 Claims, 5 Drawing Sheets

(56) References Cited

OTHER PUBLICATIONS

Hung-Kai Chen Hung-Kai Chen et al: "A self calibrated ADC BIST methodology", VLSI Test Symposium, 2002. (VTS 2002). Proceedings 20th IEEE, Apr. 18, 2002(Apr. 28, 2002), pp. 117-122, XP0930568000, DOI: 10.1109/VIS.2002.1011121, ISBN: 978-0-7695-1570-0.

Jingbo Duan et al: "Cost effective signal generators for ADC BIST", Circuits and Systems, 2009. ISCAS 2009. IEEE International Symposium On, IEEE, Piscataway, NJ, USA, May 24, 2009 (May 24, 2009), pp. 13-16, XP031479115, ISBN: 978-1-4244-3827-3.

\* cited by examiner

| Data storage in to Nonvolatile memory during each calibration routines for computation of coefficents |||||||||||
| Calibration Routine 1 ||| Calibration Routine 2 ||| Calibration Routine 3 ||| Calibration Routine 4 |||
| NVM Address | ADC value for VcTx | Computed VcTx | NVM Address | ADC value for VcTx | Computed VcTx | NVM Address | ADC value for VcTx | Computed VcTx | NVM Address | ADC value for VcTx | Computed VcTx |
| --- | --- | --- | --- | --- | --- | --- | --- | --- | --- | --- | --- |
| A1 | ADC1T1 | Vc1T1 | B1 | ADC2T1 | Vc2T1 | C1 | ADC3T1 | Vc3T1 | N1 | ADCNT1 | VcNT1 |
| A2 | ADC1T2 | Vc1T2 | B2 | ADC2T2 | Vc2T2 | C2 | ADC3T2 | Vc3T2 | N2 | ADCNT2 | VcNT2 |
| A3 | ADC1T3 | Vc1T3 | B3 | ADC2T3 | Vc2T3 | C3 | ADC3T3 | Vc3T3 | N3 | ADCNT3 | VcNT3 |
| A4 | ADC1T4 | Vc1T4 | B4 | ADC2T4 | Vc2T4 | C4 | ADC3T4 | Vc3T4 | N4 | ADCNT4 | VcNT4 |
| .. | .. | .. | .. | .. | .. | .. | .. | .. | .. | .. | .. |
| .. | .. | .. | .. | .. | .. | .. | .. | .. | .. | .. | .. |
| An | ADC1 Tn | Vc1Tn | Bn | ADC1 Tn | Vc2Tn | Cn | ADC3 Tn | Vc3Tn | Nn | ADCN Tn | Vc2Tn |

Fig. 5

CIRCUIT CALIBRATION SYSTEMS

CROSS-REFERENCE TO RELATED APPLICATIONS

This application claims priority to Indian Provisional Patent Application No. 202241022531, filed Apr. 16, 2022, the disclosure of which is incorporated by reference herein in its entirety.

FIELD

This disclosure relates to circuit calibration systems.

BACKGROUND

In circuit calibration, a known voltage is applied to the circuit input and the output is read by an intelligence module to compute the coefficients to account for the changes to the signal made by the circuit components. Though more calibration points provides greater measurement accuracy over a voltage/current operating range (e.g., a non-linear input range/signal path may require more calibration points), traditional multipoint calibration results in high cost component selection and additional circuitry. Traditional systems require additional circuit components for each calibration point, and having more components can further drive the inaccuracy in calibration coefficients as well as reliability issues.

Such conventional methods and systems have generally been considered satisfactory for their intended purpose. However, there is still a need in the art for improved circuit calibration systems. The present disclosure provides a solution for this need.

SUMMARY

In accordance with at least one aspect of this disclosure, a circuit calibration system can include a calibration voltage source, a calibration output line, and a variable voltage system connected between the calibration voltage source and the calibration output line. The variable voltage system can be configured to provide a variable calibration voltage to the calibration output line.

The system can include an intelligence module configured to control the variable voltage system to select one or more calibration voltages output from the variable voltage system. In certain embodiments, the intelligence module can be configured to receive an output voltage from a test circuit, and compare the output voltage to the selected one or more calibration voltages. In certain embodiments, the intelligence module can be configured to determine one or more coefficients of calibration to calibrate the output of the test circuit based on the comparison of the output voltage to the selected one or more calibration voltages.

In certain embodiments, the variable voltage system can include an RC circuit having a time constant and connected to the output line, and a switch between the voltage supply and the RC circuit. The intelligence module can be connected to the switch to control an on time of the switch.

The intelligence module can be connected to a gate of the switch to provide a control signal to the switch. The control signal can be a pulse signal, and the pulse signal can be output by the intelligence module based on a correlation of the pulse width to the selected one or more calibration voltages.

In certain embodiments, the intelligence module can be configured to successively sample multiple calibration points over a single pulse signal and correlate calibration voltage as a function of time. In certain embodiments, the intelligence module can be configured to output a plurality of pulses of differing pulse widths to sample multiple calibration points.

The calibration output line can be a single line connected between the test circuit and the variable voltage system. Any suitable connection type, location, and/or arrangement between the test circuit can the calibration output line is contemplated herein.

An aircraft electrical system can include a multipoint circuit calibration system, e.g., as disclosed herein, e.g., as described above. Any other suitable application for the calibration system is contemplated herein.

In accordance with at least one aspect of this disclosure, a method can include using a time variable voltage source to provide multiple calibration points to a test circuit to provide multipoint calibration. The method can also include calibrating the test circuit based on the multiple calibration points. The method can include any other suitable method(s) and/or portions thereof.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIG. 5 is a table showing an embodiment of data storage for N number of routines and calibration points in accordance with this disclosure.

DETAILED DESCRIPTION

Figure 1:
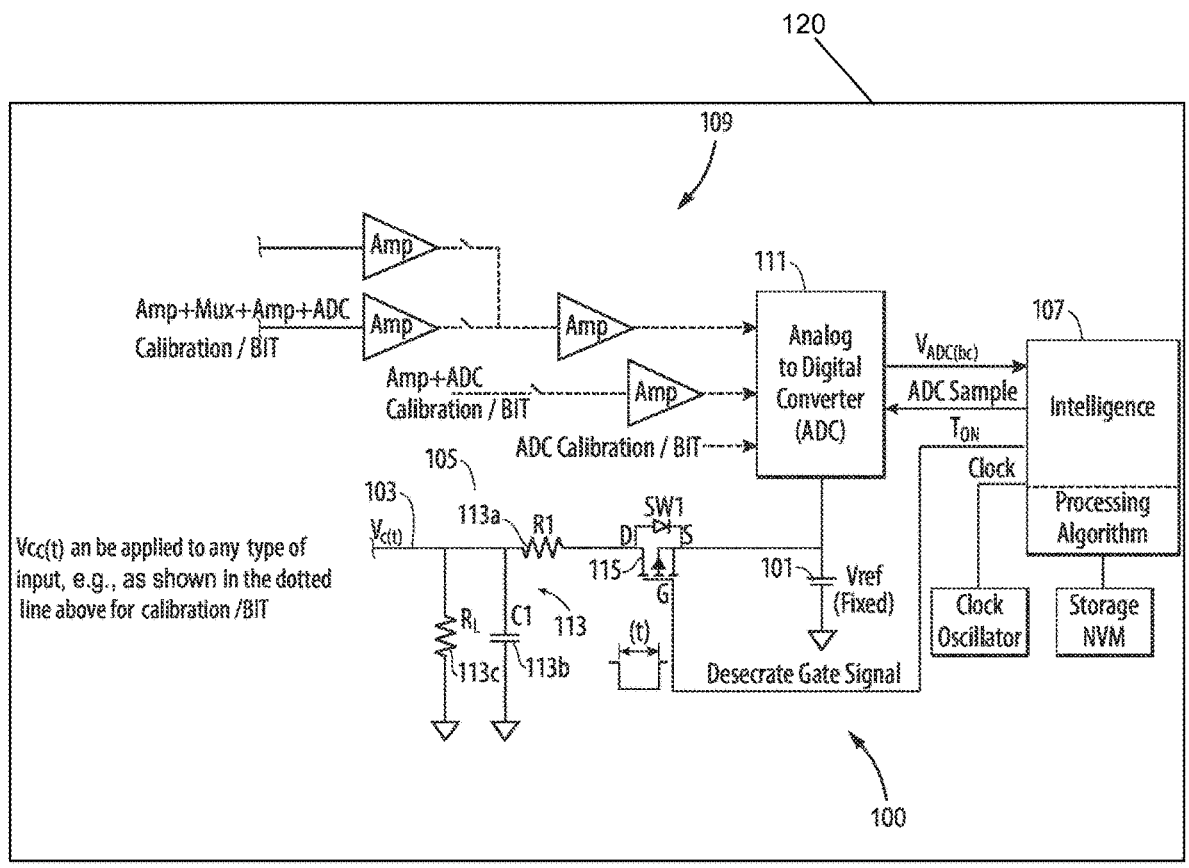
FIG. 1 is a circuit diagram of an embodiment of a system in accordance with this disclosure, shown connected to a test circuit.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100.

Other embodiments and/or aspects of this disclosure are shown in FIGS. 2-5. Certain embodiments described herein can be used to provide multipoint calibration (e.g., multiple voltage test points) of a circuit with a single output line, for example.

Figure 2:
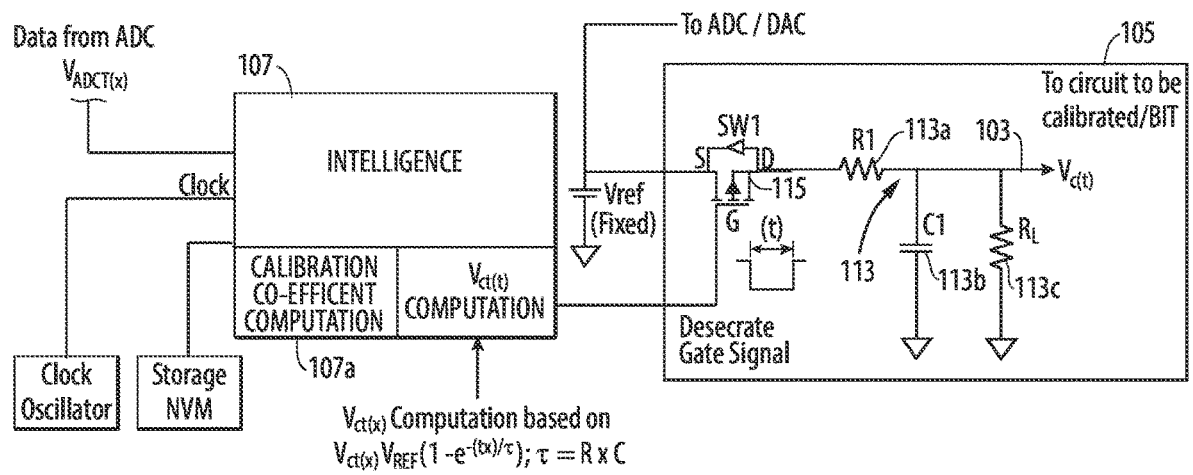
FIG. 2 is a schematic diagram of the embodiment of FIG. 1 in accordance with this disclosure, showing an embodiment of an intelligence module in accordance with this disclosure.

In accordance with at least one aspect of this disclosure, referring to FIGS. 1 and 2, a circuit calibration system 100 can include a calibration voltage source 101 (e.g., with source voltage Vref), a calibration output line 103 (e.g., a single physical connection), and a variable voltage system 105 connected between the calibration voltage source 101 and the calibration output line 103. The variable voltage system 105 can be configured to provide a variable calibration voltage (e.g., $V_{C(t)}$ as shown) to the calibration output line 101.

The calibration system 100 can include an intelligence module 107 configured to control the variable voltage system 105 to select one or more calibration voltages output from the variable voltage system 105. In certain embodiments, the intelligence module 107 can be configured to receive an output voltage (e.g., $V_{ADC(tx)}$ as shown in FIG. 1) from a test circuit 109, and compare the output voltage to the selected one or more calibration voltages. For example, the calibration output line 103 can be connected to any portion or portions (e.g., any individual or combination of the lines shown upstream of the ADC 111) of the test circuit 109 to output a variable voltage thereto. As shown, the test circuit 109 can include one or more amplifiers, multiplexers, analog-to-digital converters, and/or any other suitable component(s). In certain embodiments, the system 100 can include the test circuit 109. After passing through the test circuit 109 and/or any portion thereof, the output voltage (e.g., $V_{ADC(tx)}$) can be passed to the intelligence module 107.

In certain embodiments, the intelligence module 107 can be configured to determine one or more coefficients of calibration (e.g., at calibration coefficient module 107*a*) to calibrate the output of the test circuit 109 based on the comparison of the output voltage $V_{ADC(tx)}$ to the selected one or more calibration voltages of the variable calibration voltage $V_{C(t)}$. This can allow proper usage of the output of the test circuit 109 (e.g., which can be a sensitive measurement device, for example, where accurate output is valuable). The use of multiple calibration voltages within the range of the variable calibration voltage can allow multipoint calibration for a more accurate calibration and can allow non-linear system calibration.

In certain embodiments, the variable voltage system 100 can include an RC circuit 113 having a time constant ($\tau$) and connected to the output line 103. The RC circuit 113 can include a first resistor 113*a* having a resistance R1 and a capacitor 113*b* having a capacitance C1. The RC circuit 113 may also include a second resistor 113*c* having a resistance $R_L$ to put a minimum load on the capacitor 113*b*. The variable voltage system 100 can also include a switch 115 (e.g., a MOSFET) between the calibration voltage supply 101 and the RC circuit 113. The intelligence module 107 can be connected to the switch 115 to control an on time of the switch 115.

Figure 3:
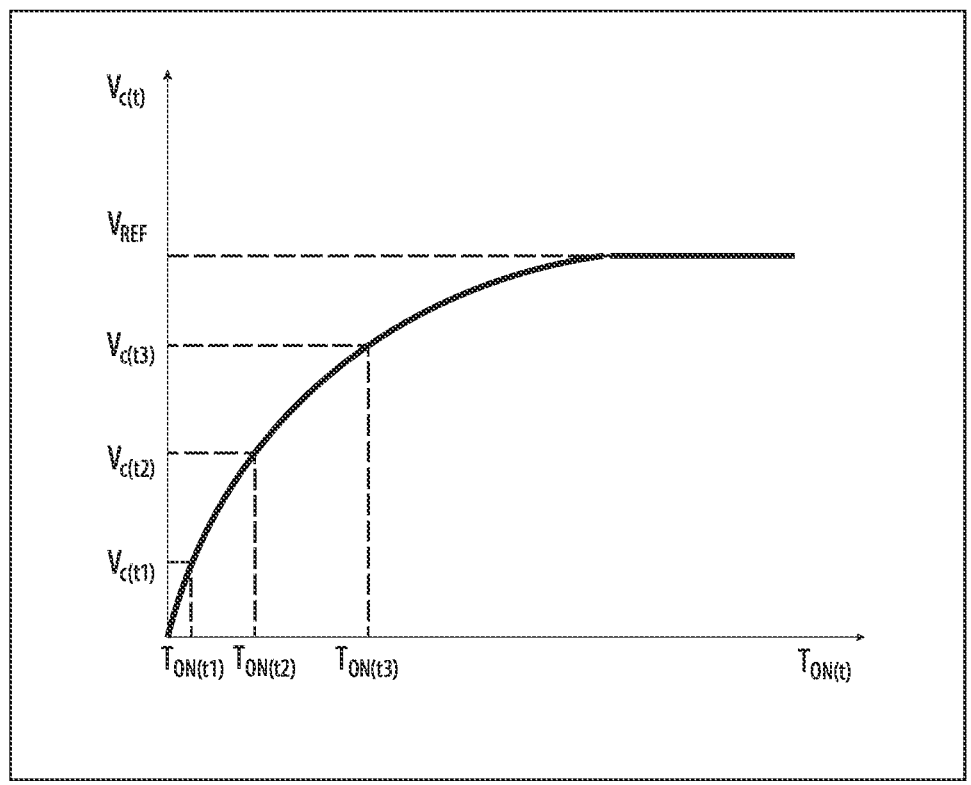
FIG. 3 is a chart showing a correlation between switch time on ($T_{ON}$) and calibration voltage ($V_{c(tx)}$) output by the embodiment of FIG. 1.

For example, the intelligence module 107 can be connected to a gate G of the switch to provide a control signal $T_{ON}$ to the switch 115. The control signal $T_{ON}$ can be a pulse signal, for example (as depicted with a pulse width time (t). The pulse signal can be output by the intelligence module 107 based on a correlation of the pulse width to the selected one or more calibration voltages. For example, the intelligence module 103 can turn on the switch 115 to ramp voltage up to a desired voltage using information about the voltage ramp. For example, as shown in FIG. 3, the time constant of the RC circuit 113 causes a voltage ramp that correlates to the on time of the switch 115. The intelligence module 107 can have this correlation and can sample the output voltage of the test circuit 109 at any desired time.

In certain embodiments, the intelligence module can be configured to successively sample multiple calibration points (e.g., at times $T_{ON(1)}$, $T_{ON(2)}$, $T_{ON(3)}$, etc.), over a single pulse signal and correlate calibration voltage as a function of time (e.g., based on the correlation shown in FIG. 3 which can be known or otherwise accessible to the intelligence module 107). For example, the intelligence module 107 can send a pulse of suitable length for the calibration voltage to reach $V_{REF}$ and can sample the output voltage $V_{ADC(tx)}$ at various times within the pulse width.

In certain embodiments, the intelligence module 107 can be configured to output a plurality of pulses of differing pulse widths to sample multiple calibration points (e.g., the top voltage of each pulse). Any other suitable pulse scheme to sample multiple voltage points by correlating to the time constant curve of the RC circuit 113 is contemplated herein.

The calibration output line 103 can be a single line (e.g., as shown) connected between the test circuit 109 (e.g., to any or all of the dotted lines as shown) and the variable voltage system 105. Any suitable connection type, location, and/or arrangement between the test circuit 109 can the calibration output line 103 is contemplated herein.

An aircraft electrical system 120 can include a multipoint circuit calibration system, e.g., as disclosed herein, e.g., system 100 as described above. Any other suitable application for the calibration system is contemplated herein.

In accordance with at least one aspect of this disclosure, a method can include using a time variable voltage source to provide multiple calibration points to a test circuit to provide multipoint calibration. The method can also include calibrating the test circuit based on the multiple calibration points. In certain embodiments, the method can include sampling multiple time points of an output voltage of a circuit and comparing the multiple points to the same time points on a known voltage curve to see a different between output voltage and calibration voltage at each point. The method can include developing one or more coefficients of calibration to calibrate the output voltage of the test circuit. The method can include any other suitable method(s) and/or portions thereof.

As shown, the RC circuit 113 has a time constant (e.g., $\tau = R \times C$). V_ct(x) is the voltage as a function of pulse time. Using this time varying voltage, embodiments can allow multi voltage functionality (e.g., as well as infinite calibration points) with one physical connection. The RC time constant value can be selected to create a desired voltage curve. The resistor 113*c* having resistance $R_L$ can be used to put a minimum load on the capacitor 113*b* capacitor. Certain embodiments of a system can be hard wired in the test circuit (e.g., a sensor circuit) and can be a Built-in-Test performed on start-up every time or at any other suitable time and/or intervals.

Embodiments can provide multipoint calibration and/or a Built-In-Test (BIT) with a single reference voltage source. The accuracy of a signal chain (includes, front end filters, buffer/amplifier, signal section/mux, gain amplifier, Analog to Digital (ADC) converter) depends on many factors and there are different ways to improve the accuracy starting from component selection through removing the known errors by calibration. Component selection for high accuracy and precision (example—filters/attenuators, amplifiers, ADC's) impacts the cost of the solution and also forces the overall solution into a single source (e.g., components from a particular supplier). Also, in general, high accuracy components lack speed per given cost limits and signal bandwidths. In certain applications, measurement accuracy is so demanding that finding the right components are very difficult even accepting a high cost of part.

Hence, to make systems independent of high accuracy components selection, removing bandwidth limitations and multi-source solutions, one alternative method is to accept errors and to remove the known errors in the signal chain to improve overall accuracy. Such a method of removing known repeated errors from signal chain can be termed calibration of the signal chain. So, where measurement accuracy is most important, systems can be designed with calibration techniques. The errors like, gain, offset, and non-linearity can be significant in any signal chain and can be removed from actual measurement as they are deterministic and constant across the analog range. If the calibration is used to improve the overall measurement accuracy, the accuracy of calibration itself is important to achieve proper calibration. Components needed for calibration further dictate the component selection issue.

One method of calibration applies a known stable voltage/current to the signal chain input and measures its output to identify errors associated in it (e.g., by an intelligent device-processing element). The processing element can know applied input voltage/current (e.g., designed values with assumptions, they are most accurate voltages/currents) and can assess the output deviation to compute corrections (calibration coefficients) to be applied for measurements. In general, the intelligence can compute the errors (e.g., offset, gain) associated with signal path over the operating voltage/current range. If the operating range is too wide and/or there is non-linear signal chain behavior, then different calibration coefficients are required for different segments of the operating range. Hence, the calibration routine/technique accuracy is greatly influenced by voltage applied (e.g., calibration voltage/current) and the number of known inputs (calibration points) to the signal chain over operating range. In general, calibration method such as 2 points, 3 points, 5 points (for example, 2 and 3 points calibration for ±5V analog range could be +5V/−5V, 0V and −5V, 0V and +5V respectively) can be used. More calibration points increase the accuracy of the measurements over operating range. But, traditionally, every calibration point needs an accurate and stable voltage source. Higher calibration points have typically required an increased number of voltage sources. These increased sources and/additional circuitry increases the cost of the calibration solution for the desired measurement accuracy. Also, additional voltage sources/reference generators and circuits can result in poor calibration accuracy due to part-to-part variation. As components in the calibration method increases, the reliability of the calibration further declines.

Considering higher calibration points provides greater accuracy, at the same time, more number of voltage sources creates more inaccuracies in the calibration routine demands, an ideal solution is to provide higher calibration points without increasing the voltage sources. Certain embodiments provide such a solution with potentially infinite calibration points and a single voltage source and/or physical connection.

Embodiments, e.g., as shown in FIGS. 1 and 2 can simplify the calibration points and calibration method to compute coefficients over signal operating range. Embodiments can provide an accurate and reliable calibration scheme with utilizing an in circuit voltage reference, e.g., $V_{REF}$ (e.g., part of data conversion) and three additional discrete components, a first resistor R1, a capacitor C1, and a MOSFET SW1. The in-circuit intelligence (e.g., intelligence module 107) can initiate the calibration routine and compute calibration coefficients. This proposed solution can generate an infinite number of calibration points over entire signal operating range (e.g., between 0 to VREF) to calibrate the signal path. The calibration coefficients can be computed over the entire operating range based on signal path non-linear behavior. Using embodiments, a single reference voltage to generate multiple calibration points makes the calibration routine insensitive to part-to-part and temperature variations.

Figure 4:
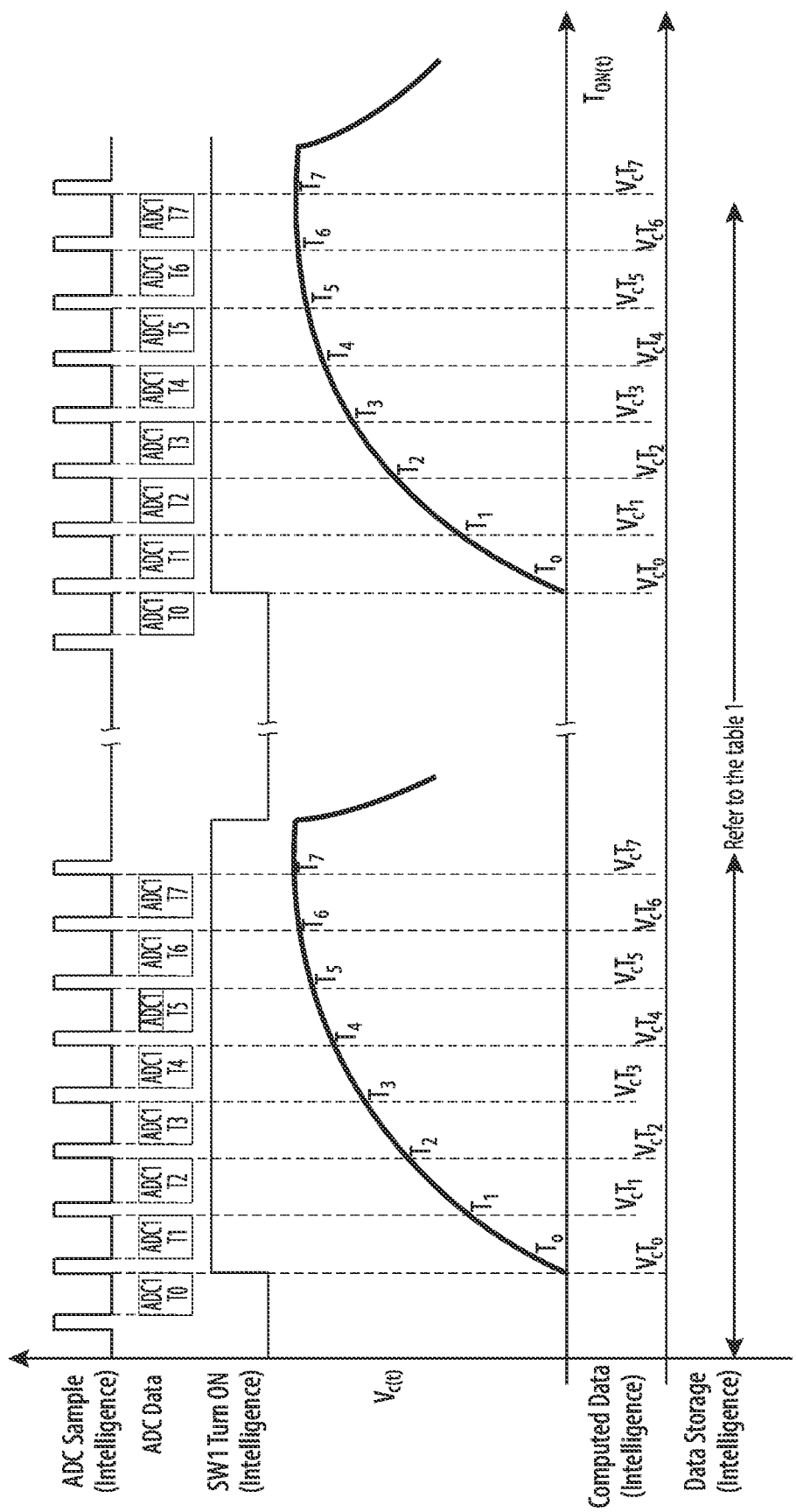
FIG. 4 is a timing diagram showing different instances and functions of the embodiment of FIG. 1.

Embodiments of a circuit an generate exponential voltage from zero volt (0V) to Reference voltage ($V_{REF}$), as shown in FIGS. 3 and 4, using an RC circuit time constant, switch, and in circuit voltage reference when initiated by an intelligence. This exponential voltage can be applied to the signal path to be calibrated (e.g., ADC or ADC+Amp or AMP+Mux+ADC etc. as shown in FIG. 1). As intelligence module (e.g., module 113) initiates the generation of exponential voltage by turning ON the switch SW1, the intelligence module (e.g., module 113) can start counting the time duration between start of SW1 turning ON and to ADC sampling initiation to compute the internal reference voltage $V_{CT(x)}$ applied to signal path as per equation 1 (below). Data points being read from ADC $V_{ADCT(X)}$ and the internal reference voltage $V_{CT(x)}$ corresponding to the ADC data $V_{ADCT(X)}$ can be stored in to the internal memory for subsequent computation.

This process can continue over entire exponential voltage range (e.g., 0-$V_{REF}$). This way, embodiments can create an infinite number of calibration voltages to be applied to a signal path for calibration. Once the desired amount of data points are complete, the intelligence module (e.g., module 107) can be configured to turn OFF the switch and can wait to discharge the voltage across capacitor before start of a next initiation, for example. In certain embodiments, the intelligence module repeat this process one or more times to get a desired amount of ADC data points on each particular calibration points $V_{CT(X)}$ for averaging before computing the errors associated for that instant for the entire range. Once sufficient data points have been acquired, the intelligence module can retrieve the data from memory on same time sampling from multiple calibration routines, average the date (e.g., to remove any noise related data), and computes error which can be defined as a difference between computed internal reference to ADC read out. As the error point appears across each data point, a processor can be configured to choose particular subsection of the operating range to correct actual measured data. The number of calibration points being considered for calibration can depend on the RC time constant (R*C), ADC sampling capability, intelligence capability (e.g., speed) to compute internal reference, reading ADC data, and computing error, for example.

The internal reference voltage VCT(x) can calculated as below.

$$V_{CT(X)} = V_{REF}(1 - e^{-(t)/\tau})  \quad \text{equation (1)}$$

$V_{CT(X)}$=computed internal voltage by intelligence module, e.g., in volts $V_{REF}$=designed reference value in circuit, e.g. in volts τ=R*C, e.g., in seconds t=measured time by intelligence from Switch Turn ON until ADC sampling event, e.g., in seconds.

Design data can provide R and C values which R*C values gives time constant (τ) which is fixed and most accurate based on the component selection (tighter component tolerance and temperature variations), and Vref (fixed value and accurate over parts and operating temperature) and time duration between SW1 turn ON to the ADC sampling(T(x)). Embodiments can be configurable to choose number of calibration points and voltage to be applied to the signal path to be calibrated.

In certain embodiments, calibration routine time can depend on the RC time constant, number of calibration points, ADC sampling and intelligence processing capability. All these parameters can be configurable. In certain embodiments, R (e.g., better than ±0.1%, <25 ppm/° C.) and C (e.g., better or equal to ±1%, COG/NPO) values can be very precise and can be taken as constant in the processing algorithm. Suitable circuit components are available with wide operating temperature range.

In certain embodiments, $V_{REF}$ is a precision voltage reference and can be available up to ±0.05% tolerance and 10-20 ppm/° C. for better calibration accuracy, for example. In certain embodiments, the switch (e.g., a MOSFET) resistance (ON resistance) can be very negligible compared to the R1 value, and may not vary much with temperature.

In certain embodiments, $V_{CT(X)} = V_{REF}(1-e-(t)/\tau)$; $\tau = R*C$, and $V_{REF}$, R and C are designed values. In certain embodiments, $V_{CT(X)}$ can be be calculated by the intelligence module without any additional inputs. Errors associated with this computation can be very negligible due to high resolution counters to provide accurate time measurements.

In certain embodiments, calibration coefficients (e.g., gain and offset) can be calculated based on $V_{CT(X)}$ and $V_{ADCT(X)}$ at zero voltage input and at the maximum calibration voltage, for example. Any other suitable calculation of coefficients is contemplated herein. In certain embodiments, the calibration routine can be repeated multiple times to get enough ADC sample on the calibration voltage for averaging before computing the errors/coefficients.

FIG. 2 shows an example of the computation of calibration coefficients based on Vct(x). FIG. 3 is a chart showing a correlation between switch time on ($T_{ON}$) and calibration voltage ($V_{c(tx)}$) output by the embodiment of FIG. 1. FIG. 4 is a timing diagram showing different instances and functions of the embodiment of FIG. 1. FIG. 5 is a table showing an embodiment of data storage for N number of routines and calibration points in accordance with this disclosure. FIG. 5 shows A1-An address locations based on calibration points. FIG. 5 also shows A-N based number of samples required on each calibration point (e.g., for averaging) before computation of coefficients.

Embodiments can provide an accurate method of multipoint calibration over entire input range (0 to +VREF) without adding additional precision voltage references and voltage deriving circuits. Embodiment can be highly cost effective as the total number of circuit components used in certain embodiments include a resistor, a capacitor, and MOSFET which acts as a switch.

Embodiment can use a lesser number of components to provide highly reliable and repeatable calibration results. Embodiment can be much less sensitive to the operating temperature due to a single voltage reference with three discrete components (e.g., R, C and MOSFET).

Embodiment can provide multipoint calibration throughout the entire operating temperature range with minimal calibration error, e.g., because of single voltage reference.

Embodiment can be very well suited to test any circuit through a Built-In Test (BIT) feature. Embodiment can be implemented easily with a PLD/FPGA as an intelligence module.

Embodiments (e.g., intelligence module) can include any suitable computer hardware and/or software module(s) to perform any suitable function (e.g., as disclosed herein).

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN)

or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A circuit calibration system, comprising:
a calibration voltage source configured to output a fixed reference voltage;
a calibration output line;
a variable voltage system connected between the calibration voltage source and the calibration output line, wherein the variable voltage system is configured to provide a variable calibration voltage based on the fixed reference voltage to the calibration output line; and
an intelligence module configured to:
control the variable voltage system to select one or more calibration voltages output from the variable voltage system;
receive an output voltage from a test circuit; and
compare the output voltage to the selected one or more calibration voltages.

2. The circuit calibration system of claim 1, wherein the intelligence module is further configured to determine one or more coefficients of calibration to calibrate the output voltage of the test circuit based on the comparison of the output voltage to the selected one or more calibration voltages.

3. The system of claim 1, wherein the calibration output line is a single line connected between the test circuit and the variable voltage system.

4. The system of claim 1, wherein the circuit calibration system forms part of an aircraft electrical system.

5. A circuit calibration system, comprising:
a calibration voltage source configured to output a fixed reference voltage;
a calibration output line;
a variable voltage system connected between the calibration voltage source and the calibration output line, wherein the variable voltage system is configured to provide a variable calibration voltage based on the fixed reference voltage to the calibration output line; and an intelligence module configured to control the variable voltage system to select one or more calibration voltages output from the variable voltage system;
wherein the variable voltage system includes:
an RC circuit having a time constant and connected to the calibration output line; and
a switch between the calibration voltage source and the RC circuit, wherein the intelligence module is connected to the switch to control an on time of the switch.

6. The system of claim 5, wherein the intelligence module is further configured to:
receive an output voltage from a test circuit; and
compare the output voltage to the selected one or more calibration voltages.

7. The system of claim 5, wherein the intelligence module is connected to a gate of the switch to provide a control signal to the switch.

8. The system of claim 7, wherein the control signal is a pulse signal, wherein the pulse signal is output by the intelligence module based on a correlation of pulse width to the selected one or more calibration voltages.

9. The system of claim 8, wherein the intelligence module is configured to successively sample multiple calibration points over a single pulse signal and correlate calibration voltage as a function of time.

10. The system of claim 8, wherein the intelligence module is configured to output a plurality of pulses of differing pulse widths to sample multiple calibration points.

11. The system of claim 5, wherein the circuit calibration system forms part of an aircraft electrical system.

12. An aircraft electrical system, comprising:
a circuit calibration system comprising:
a calibration voltage source configured to output a fixed reference voltage;
a calibration output line; and
a variable voltage system connected between the calibration voltage source and the calibration output line, wherein the variable voltage system is configured to provide a variable calibration voltage based on the fixed reference voltage to the calibration output line.

13. A method, comprising:
using a time variable voltage source to provide multiple calibration points to a test circuit to provide multipoint calibration;
calibrating the test circuit based on the multiple calibration points, wherein the multiple calibration points are based on a fixed reference voltage;
controlling, by an intelligence module, the time variable voltage source to select one or more calibration voltages output from the time variable voltage source;
receiving, by the intelligence module, an output voltage from the test circuit; and
comparing, by the intelligence module, the output voltage to the selected one or more calibration voltages.

14. The method of claim 13, further comprising:
determining, by the intelligence module, one or more coefficients of calibration to calibrate the output voltage of the test circuit based on the comparison of the output voltage to the selected one or more calibration voltages.

15. The method of claim 13, wherein:
the time variable voltage source is connected between the intelligence module and an output line from the time variable voltage source to the test circuit; and
the time variable voltage source includes:
an RC circuit having a time constant and connected to the output line; and
a switch between the RC circuit and a calibration voltage source that is configured to output the fixed reference voltage, wherein the intelligence module is connected to the switch to control an on time of the switch.

16. The method of claim 15, wherein the intelligence module is connected to a gate of the switch to provide a control signal to the switch.

17. The method of claim 16, wherein:
the control signal is a pulse signal; and
the method further comprises outputting, by the intelligence module, the pulse signal based on a correlation of pulse width to the selected one or more calibration voltages.

18. The method of claim 17, further comprising:
successively sampling, by the intelligence module, the multiple calibration points over a single pulse signal; and
correlating, by the intelligence module, calibration voltage as a function of time.

19. The method of claim 17, further comprising:
outputting, by the intelligence module, a plurality of pulses of differing pulse widths to sample multiple calibration points.

20. The method of claim 13, wherein the time variable voltage source and the intelligence module form part of a circuit calibration system in an aircraft.

* * * * *